United States Patent [19]

Ledger et al.

[11] Patent Number: 5,515,167
[45] Date of Patent: May 7, 1996

[54] TRANSPARENT OPTICAL CHUCK INCORPORATING OPTICAL MONITORING

[75] Inventors: Anthony Ledger, Newfairfield; Michael Power, Newtown, both of Conn.

[73] Assignee: Hughes Aircraft Company, Los Angeles, Calif.

[21] Appl. No.: 304,984

[22] Filed: Sep. 13, 1994

[51] Int. Cl.[6] ........................................ G01B 9/02
[52] U.S. Cl. ............................ 356/357; 356/360
[58] Field of Search ..................... 356/357, 359, 356/360; 279/128, 3

[56] References Cited

U.S. PATENT DOCUMENTS 4,932,781  6/1990  Kuwayama ........................ 356/357
5,363,171  11/1994  Mack ................................ 355/68

Primary Examiner—Samuel A. Turner
Assistant Examiner—Robert Kim
Attorney, Agent, or Firm—W. C. Schubert; K. W. Denson-Low

[57] ABSTRACT

A transparent chuck is used to force a semiconductor wafer to take a prescribed shape. Any gap which is formed between the chuck and the wafer can be imaged through the transparent chuck. An interferometer is used to illuminate the gap with a narrow band illumination to create interference fringes in the gap. The fringes can be electronically imaged to create a digital input to a computer. Merit functions corresponding to the total volume of fringes in the gap or to the summation of nearest neighbor slopes of such fringes provide a measure of the thickness of such gap.

25 Claims, 2 Drawing Sheets

TRANSPARENT OPTICAL CHUCK INCORPORATING OPTICAL MONITORING

BACKGROUND OF THE INVENTION

1. Field of the Invention

The present invention relates to a chuck which is used to force a semiconductor wafer to take a prescribed shape and the process of using it. The chuck allows optical monitoring of the residual air space between the rear surface of the wafer and the front surface of the chuck using an interferometric optical system.

2. Prior Art

Current chucks used to flatten wafers in metrology systems or in stepper machines have no way of monitoring if the chuck actually causes the wafer to conform exactly to the chuck surface without leaving an air space. Previously this error was ignored since the thickness variations in silicon wafers could be as high as 25 microns. The development of AccuFlat™ wafers by Hughes Danbury Optical Systems, Inc., Danbury, Conn., in which the wafer surfaces are highly parallel requires improved chucks which can pull down a wafer so as to leave an air space much less than the wafer thickness tolerance of 0.1 micron.

Chucks used to shape a wafer to a prescribed form must be capable of operating in either air or vacuum and these requirements have lead to the commercial development of vacuum chucks as well as electrostatic chucks. Both vacuum chucks and electrostatic wafer chucks which are commercially available have opaque bodies and do not allow any measurement of how well the wafer is shaped to the chuck surface.

Vacuum chucks initially used waffle iron or bed of nails patterns on the chuck surface in an attempt to reduce the area of the chuck in contact with the wafer. This was done to minimize the trapping of dust particles between the wafer and the chuck surface. These types of designs suffer from print through of the chuck surface pattern onto the top surface of the wafer. This was not a severe problem before the availability of AccuFlat™ wafers since the older wafers had huge thickness variations on the order of tens of microns.

Electrostatic chucks are large area capacitors in which the electrodes can either be a single plane at high voltage separated from the grounded wafer by an insulating layer such as Kapton™, manufactured by DuPont or a multiple type where alternate metal electrodes are maintained at two different high potentials (plus and minus several hundred volts) and separated from the wafer by an insulating layer. In the latter case the wafer does not require deliberate grounding to be part of the electrostatic circuit.

SUMMARY OF THE INVENTION

This invention consists of a new type of chuck which is used to force a semiconductor wafer, such as a silicon wafer, to take a prescribed shape. The chuck is transparent and its surface is usually polished optically flat to a fine tolerance but it can also be a substrate having an optically polished surface in the form of a sphere, parabola, ellipse or toroid or any other desired shape to provide correspondingly shaped wafer surfaces The principal difference between the chuck of this invention and those used in the prior art is that the new chuck body is transparent. The apparatus of this invention uses an interferometric optical system to provide optical monitoring of fringes in the residual air space between the rear surface of the wafer and the opposing surface of the transparent chuck.

The wafer is forced to assume the shape of the chuck surface by using either a vacuum or an electrostatic field and either type can be configured such that the residual fringe pattern can be monitored through the transparent chuck. In the case of a vacuum chuck, the surface is preferably made from glass and small holes less than the wafer thickness are used to create vacuum paths below the wafer. In the electrostatic case, the fringes are viewed through the base electrode which is preferably fabricated from a transparent electrically conductive film (hereinafter referred to as an EC film) coated or applied onto a glass substrate, or a metal grid imbedded in the chuck or a hybrid EC film with grids embedded in the chuck to lower the electrode resistance further.

The optical system preferably uses a single optical wavelength from a He—Ne laser, laser diode, a discharge lamp or filtered white light source to create interference fringes which are recorded by an electronic camera. In accordance with the process of this invention the recorded image is analyzed to provide merit functions which describe the closeness of fit between the wafer and the chuck. The merit functions approach zero when the wafer and chuck are exactly same shape and there is no residual air space. In accordance with this invention a simple optical measurement is made of the air space at the junction between the adjacent chuck top surface and the opposing or rear surface of the semiconductor wafer. The air space is illuminated through the transparent chuck by a single narrow band light source of preferably a Fizeau interferometer. An electronic camera records a CCD (charged coupled device) image of the fringes which are formed in the residual air space between the chuck surface and the opposing polished or lapped surface of the semiconductor wafer. This CCD fringe pattern is then analyzed to determine if the chuck and wafer are in perfect contact. Merit functions proportional to the total fringe volume or to a summation of nearest neighbor slopes will be zero if the wafer conforms to the chuck, i.e. there will be no fringes and no detectable slopes across the image other than residual noise slopes. The measured merit functions provide a measurement of the magnitude of the residual air space or gap.

A further application of the chuck and process of this invention is the use of these chucks in steppers, particularly those which use the AccuFlat™ wafers. In accordance with this invention one can measure the wafer/chuck conformity to less than the depth of focus of a UV stepper.

BRIEF DESCRIPTION OF THE DRAWINGS

The foregoing aspects and other features of the invention are explained in the following description, taken in connection with the accompanying drawings, wherein.

DETAILED DESCRIPTION OF THE INVENTION

Figure 1:
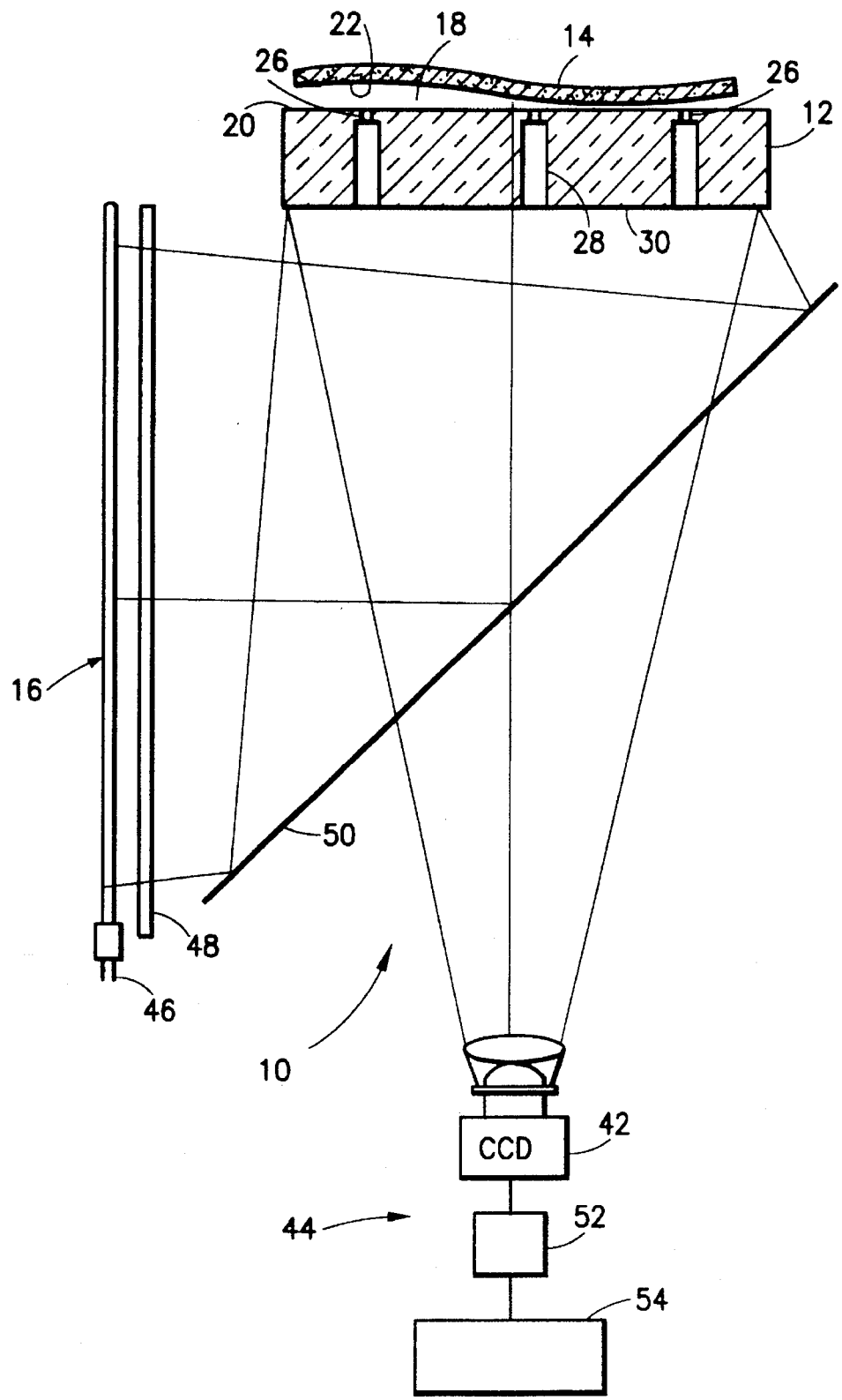
FIG. 1 is a schematic view of an apparatus in accordance with this invention comprising a vacuum chuck supporting a semiconductor wafer and an optical system for illuminating the gap between the chuck and the wafer and for digitizing an image of the fringes localized in the gap.

Referring to FIG. 1 there is shown an apparatus 10 in accordance with one embodiment of this invention comprising a transparent chuck 12 supporting a semiconductor wafer 14 such as a silicon wafer and an optical system 16 for forming and monitoring interferometric fringes in the residual gap 18 between the first surface 20 of the chuck 12 and the opposing first surface 22 of the wafer 14. The wafer 14 can be supported on such a chuck 12 at various stages in semiconductor wafer fabrication including, for example, photolithography in a stepper, deposition or diffusion steps. While a vacuum chuck 12 is shown the transparent chuck 12 of this invention may be of any desired design so long as it is transparent.

Chucks 12 used to shape a wafer 14 to a prescribed form must be capable of operating in air or vacuum and these requirements have lead to the commercial development of vacuum chucks 12 as well as electrostatic chucks 24 as will be described later by reference to FIGS. 3 and 4.

Figure 2:
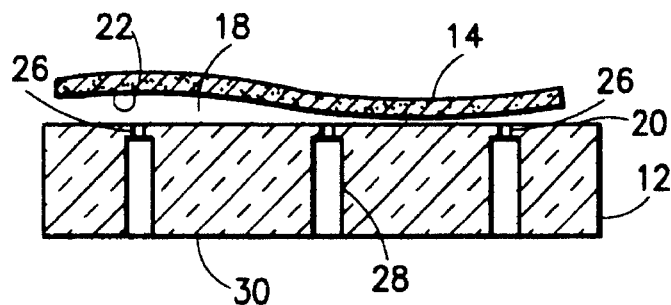
FIG. 2 is a side sectional view of vacuum chuck in accordance with one embodiment of this invention, supporting a semiconductor wafer.

In the embodiment of FIGS. 1 and 2 the driving force is a vacuum but this type of chuck 12 is limited to a system 10 which can operate in air. Vacuum chucks 12 initially used waffle iron or bed of nails patterns on the chuck surface in an attempt to reduce the area of the chuck 12 in contact with the wafer 14. This was done to minimize the trapping of dust particles between the wafer surface 22 and the chuck surface 20. These types of designs suffer from print through of the chuck surface pattern onto the top surface of the wafer. This was not a severe problem when wafers 14 had huge thickness variations of the order of tens of microns but it is a problem with AccuFlat™ wafers 14 which have small thickness variations.

Vacuum designs in accordance with this invention attempt to minimize print-through problems by using a transparent optically polished surface 20 in which small holes 26 (less than the wafer thickness of about 600 microns) are drilled into the polished surface 20 to allow the vacuum path to exhaust the air in the gap 18 between the polished surface 20 and the surface 22 of the wafer 14. The pattern of tiny holes 26 does not interfere with the air space or residual gap 18 measurement since the total area of the holes 26 is extremely small compared with the wafer 14 area.

In order to provide an optically polished surface 20 the chuck 12 is preferably formed out of a glass substrate, however any desired transparent material could be used. The holes 26 preferably are arranged about the entire surface of the chuck 12. The inter-hole spacing is preferably on the order of the wafer 14 thickness (i.e. about 600 microns). If for example, the inter-hole spacing is about 1 millimeter a 200 millimeter chuck 12 could require as many as 40,000 holes 26. Such a large number of hoes 26 would be difficult to drill, however they could be formed by any desired technique known in the art, including photolithography and etching, laser machining or the like. The holes 26 are preferably from about 300 to about 500 microns in diameter and are laser machined into the surface 20 in any desired pattern. In order to minimize pressure drops larger diameter countersunk or cored holes 28 are machined into the opposing second surface 30 of the chuck 12, in a generally coaxial relationship to the holes 26, by any desired technique, such as the use of a laser. A suitable vacuum source (not shown), such as a pump, is connected in a conventional manner to the countersunk holes 28 either through the use of individual conduits (not shown) connected to each of the holes 28 or through the use of a suitable plenum (not shown) connected to the surface 30 and to the vacuum source.

Figure 3:
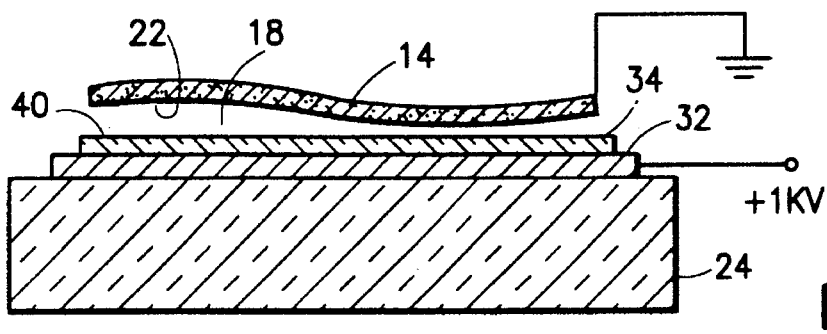
FIG. 3 is a side sectional view of a monopole electrostatic chuck in accordance with another embodiment of this invention, supporting a semiconductor wafer.
Figure 4:
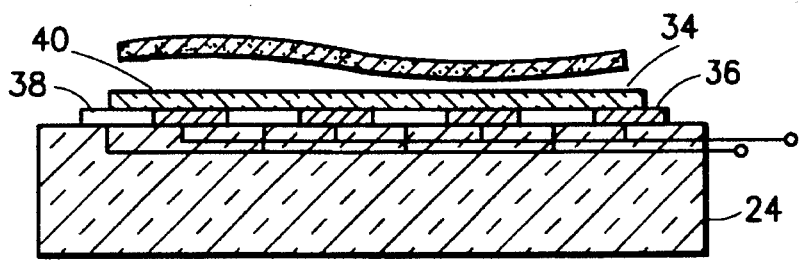
FIG. 4 is a side sectional view of a multipole electrostatic chuck in accordance with yet another embodiment of this invention, supporting a semiconductor wafer.

Referring now to FIGS. 3 and 4 electrostatic chucks 24 are shown which can be employed in the apparatus 10 of FIG. 1 as a substitute for the vacuum chuck 12 shown therein. The chucks 24 comprise large area capacitors in which the electrodes can either be a single plane electrode 32 at a high or other desired voltage separated from the grounded wafer by an insulating layer 34 such as Kapton™ or glass or other material as desired, or a multiple electrode type where alternate metal electrodes 36 and 38 are maintained at two different high potentials (plus and minus several hundred volts) or other desired differential voltages and separated from the wafer 14 by an insulating layer 34. In the latter case the wafer 14 does not require deliberate grounding to be part of the electrostatic circuit. The voltages which are used are sufficient to force the wafer 14 into substantial conformity with the chuck surface 40. Conventional electrostatic chucks use potential differences of hundreds of volts, however a design in accordance with this a preferred embodiment of this invention can reduce the necessary potential difference to less than about 100 volts.

The electrostatic chuck designs 24 in accordance with this invention based upon a transparent substrate require that the metal electrode structures 32 or 36 and 38 used respectively for planar or multiple electrode chucks 24 be sufficiently transparent to allow fringes to be formed and measured. Preferably this is accomplished by using electrically conducting film or coated electrodes of the type developed over the years for EMI shielding. Many coatings are available since high optical transmission is only required over a narrow wavelength range. Preferably one can use either an electrically conductive (EC) transparent thin film or coating or a continuous thin metal layer (with matching outer layers). The transparent metal layer will be a few hundred angstroms thick and the matching layers comprise dielectric layers which increase the transmission by attempting to match the refractive index of the metal to that of air to the extent possible. Alternatively an immersed metal grid structure can be embedded in the chuck 24 or an EC/immersed grid hybrid structure can be embedded therein. It is possible in accordance with this invention to provide extremely efficient 1 ohm/square conductive coatings which transmit >80% in the visible region. Electrostatic chucks fabricated using electrically conductive films or coatings are thus compatible with the fringe volume measurement system 10 of this invention since the silicon/air/glass interface can be viewed optically through the EC film or coating.

The Kapton™ dielectric layer could alternatively be any desired high strength dielectric material such as, for example, boron nitride, fused silica, aluminum oxide, silicon, etc. For example, an electrically conductive coating was deposited by evaporation in a vacuum and overcoated with a thin (about 0.1 micron) layer of aluminum oxide. Although the aluminum oxide layer was slightly porous due to being deposited by evaporation using an electron beam gun, the voltage needed to pull down a large part of a wafer 14 was only 30 to 40 volts. This compares with much higher voltages of 700 to 800 volts required by current commercial chucks which use a much thicker Kapton™ layer on the order of 25 to 50 microns thick.

Referring now to FIG. 3 a transparent chuck 24 design having a monopole electrode 32 is shown. In the chuck 24 a capacitor is formed by the continuous layer of electrically conductive film 32 and the grounded wafer 14. Biasing the EC layer 32 at voltages up to about 1 KV with the wafer 14 grounded causes the wafer 14 to be pulled against the chuck 24 surface 40 by electrostatic forces.

Referring now to FIG. 4 a transparent chuck 24 design having a multiple electrode 36 and 38 is shown. In this embodiment alternate electrodes 36 or 38 are electrically connected to opposing potentials creating a potential drop between such alternating electrodes 36 or 38 of up to about 1 KV. The bias created between the respective alternating electrodes 36 and 38 causes the wafer 14 to be pulled against the chuck 24 surface 40 without requiring that the wafer 14 be grounded as part of the electrostatic circuit. The electrostatic chucks 24 of FIGS. 3 and 4 are not limited to metrology or wafer fabrication systems 10 which operate in air as is the case for vacuum chucks 12.

In accordance with this invention a preferred embodiment of an electrostatic chuck 24 can be constructed as follows. A high dielectric breakdown bulk transparent material such as boron nitride or fused silica or other desired material is ground or polished down by standard techniques for two sided polishing. The polishing is preferably carried out by plasma-assisted chemical etching to a thickness of less than about 15 microns and preferably about 10 microns or less. After polishing the dielectric material preferably is a free standing film or membrane 34 which is capable of being handled so that it can be vacuum coated. One side of the membrane 34 is now coated (as by vapor deposition or other desired technique) with an electrically conducting film 32 of about 1 to 2 ohm/square electrical resistance. Alternatively a metal grid 32 (typically gold or any other desired material) wherein the grid squares are preferably several hundred microns (i.e. greater than about 400 microns and preferably greater than about 500 microns) in dimension and the grid lines are preferably about 30 to about 50 microns wide can be coated or deposited on the membrane 34. The grid allows most of the light to pass through so that an interferometric measurement of the air space or gap 18 can be made.

The membrane 34 coated with the electrically conductive film or grid 32 is cemented (or affixed by any desired means) to a fused silica, glass or other desired transparent material substrate or chuck 24 using optical cement or any other desired technique for adhering the membrane 34 to the chuck 24. The electrically conductive coating or metal grid 32 is sealed between the membrane 34 and the massive transparent substrate of chuck 24. At this point the outer surface 40 of the membrane 34 which is adapted to support the wafer 14 is not optically flat even though the surface 20 of the massive substrate or chuck 24 is flat. This is the case since the optical cement layer can have thickness variations and the two sided polishing of the membrane 34 does not provide a totally parallel thin slab.

Fortunately the surface figure of the top surface 40 can be measured by conventional interferometry if the deviation is less than a ½ wave. If the top surface 40 deviation is more than about ½ wave then one can use a multispectral thin film mapper, such as the one described in U.S. Pat. No. 5,333,049, to the inventor herein, which patent is specifically incorporated by reference herein, to measure the surface 40 deviation. This is accomplished by using the mapper to measure the air gap between the surface 40 and a known optical flat to provide a surface map. The surface 40 is then flattened by conventional polishing or preferably through the use of plasma assisted chemical etching techniques as are known in the art. Numerous patents assigned to Hughes Aircraft Company, the assignee of the present invention, describe plasma-assisted chemical etching (PACE) for producing thin uniform films. The PACE process can be used to thin the membrane 34 and to flatten its surface 40. This method of constructing an electrostatic chuck 24 has the potential to produce electrostatic chucks which operate at lower voltages, (i.e. 50 instead of 800). Accordingly in accordance with this embodiment the electrostatic chuck 24 is capable of operating at less than about 200 volts and preferably less than about 100 volts potential drop.

Referring again to FIG. 1 the optical system 16 requires that the semiconductor wafer 14 surface 22 being viewed be polished or finely lapped to increase the reflectance, compared with the coarse ground surfaces normally found on silicon wafers. It is possible that even ground surfaces can be used to form fringes if oblique incidence illumination is used. One can obtain fringes between ground surfaces and polished surfaces but the fringe quality (maximum to minimum ratio) depends critically upon the surface roughness of the ground surface. To obtain fringes at normal incidence the surface needs to be lapped to a surface roughness in the region of a tenth of a micron. Conventional ground surfaces such as are found on the back surface of a silicon wafer are much rougher than this and therefore require that a high incidence angle be used The effects of surface roughness decrease as the incidence angle increases.

FIG. 1 shows a simple optical system 16 which can produce high finesse fringes at a CCD (charged coupled device) sensor 42 of an electronic camera 44. The light source 46 for this system 16 is preferably a neon discharge tube of the type normally used for optical testing of polished surfaces. These discharge lamps 46 emit light over a narrow band at 5493 Å and can be formed into a large area lamp by folding a long discharge tube. The light source 46 could be a He—Ne laser a laser diode or a narrow band filtered light source of any desired type depending upon the source coherency requirements. U.S. Pat. No. 5,291,269, to the present inventor, illustrates a suitable light source and is specifically incorporated by reference herein. Typically the coherence length should be sufficient only to cause fringes to be created in the gap 18 and not by other optical surfaces in the chuck 12.

A ground glass screen 48 in front of the lamp 46 creates a large extended source which is used to illuminate the chuck 12/residual gap 18/semiconductor wafer 14 structure by means of a beamsplitter 50 which preferably comprises a piece of uncoated glass or it may be partially silvered. However, any desired beam splitter as are known in the art could be used. In this example the light from the source 46 is reflected by the beam splitter 50 through the glass of the chuck 12 and the residual air gap 18 until it reaches the surface 22 of the silicon wafer 14. Reflections from the surface 22 of the silicon wafer 14 and the surface 26 of the chuck 12 result in a Fizeau fringe pattern if there is any residual air gap 18. If the apparatus 10 is employed with a vacuum system the gap 18 would be a vacuum and an electrostatic chuck 24 would be used in place of the vacuum chuck 12. Similarly while the gas in the gap 18 in this embodiment is described as being air it could be any desired gas including inert gases such as argon etc. or reactive gases used for deposition or diffusion etc.

An image of the fringes, if any, in the gap 18 is recorded through the rear surface 30 of the chuck 12 by a CCD sensor 42 of an electronic camera 44 further including frame grabber 52 (digitizing circuit for the video image from camera 44) and computer system 54. The computer 54 receives the output of the electronic camera 44 and checks for the existence of fringes such as Fizeau fringes in the image of the gap 18. The optical system 16 shown in FIG. 1 is preferably in the nature of a Fizeau interferometer.

Numerous other optical systems 16 as are known in the art can be used to record the fringes, as for example, those disclosed in the present inventors earlier patents which have been incorporated by reference herein. These also include line and point scanning systems where data is obtained in a more sequential manner by either moving the wafer 14/chuck 12 unit under a light beam or by optically scanning a light beam across the wafer 14/chuck 12 interface at high speed. Even conventional photography could be employed to photograph the fringe pattern in the gap 18 through the chuck 12 which photograph can then be examined to determine if fringes are present as well as their number and magnitude. While the interferometer 16 is preferably of a Fizeau design any desired interferometer as are known in the art could be used to generate a fringe pattern indicative of the gap 18 between the wafer 14 and the chuck 12.

The vacuum chuck 12 configuration in the example of FIGS. 1 and 2 consists of a glass/air/silicon Fizeau interferometer where the reflectance varies as the air space is varied. Averaging the reflectance over the narrow band illumination accounts for coherence effects in the measurements. In the case of the electrostatic chuck 24 embodiments of FIGS. 3 and 4, the configuration also consists of a glass/air/silicon Fizeau interferometer, with the addition of other layers due to the EC layer 32 or 36 and 38, and the top insulating layer 34 bonded thereto. The reflectance in these electrostatic embodiments depends upon the specific film thicknesses as well as the spectral width (coherence length effects) of the illuminating radiation. In general over a narrow band this simply leads to a reflectance offset and does not compromise the measurement of the fringes. Variations in the gap 18 thickness still primarily modulate the reflected light.

Figure 5:
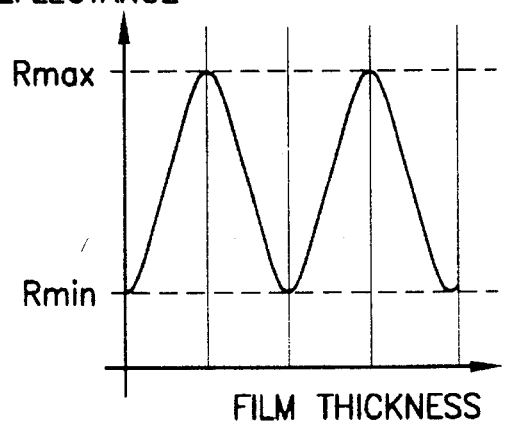
FIG. 5 is a graph showing the relationship between fringe reflectance and the thickness of the gap or air space between the chuck and the wafer.

FIG. 5 shows the variation in reflectance for the basic Fizeau image having unequal amplitude reflectance at the two surfaces 20 and 22 surrounding the gap 18 being measured. A digitized image of the gap 18 provided as an output of the camera 44 can be used to determine the existence of fringes in several ways. First an estimate of the "volume of fringes" can be found by computing a merit function. The reflectance at any point is normalized to remove any variations in illumination uniformity U(x,y) and a merit function is computed in accordance with the following equation:

$$\sum_{n=1}^{K} (R(x,y)/U(x,y) - R_{Theory}(x,y))^2$$

where K is the total number of points in the image, R(x,y) is the special reflectance and $R_{theory}(x,y)$ is the computed reflectance for the case where the gap 18 is zero. If the chuck 12 or 24 design truly shapes the wafer 14 to the chuck surface 20 then the gap 18 will approach zero and the above merit function will rapidly approach zero. Table I shows reflectance and merit function values for 4096 points in an image of a glass/air/silicon Fizeau fringe pattern for various gap thicknesses, and indicates the sensitivity of the method of this invention.

TABLE I

Merit Function Values For A Glass/Air/Silicon Fizeau Fringe Volume Merit Function

| Gap Thickness μ | Reflectance % Function | Fringe Volume Merit |
|---|---|---|
| 0.0 | 20.2 | 0 |
| 0.01 | 20.4 | 167 |
| 0.02 | 20.9 | 2123 |
| 0.03 | 21.9 | 11837 |
| 0.04 | 23.14 | 35887 |
| 0.05 | 24.65 | 81841 |
| 0.075 | 29.2 | 333252 |
| 0.1 | 34.21 | |
| 0.25 | 50.55 | |

Reference to FIG. 5 indicates that the measurement becomes ambiguous after a half wave of optical thickness is reached in that the values repeat. This is not expected to be a problem since one can assume that the chuck 12 or 24 design will reduce the residual gap 18 to less than a half wave.

A second method which is a sensitive measure of the existence of fringes is to compute a merit function which is the sum of nearest neighbor slopes i.e.

$$\sum_{n=1}^{K} \left[ \frac{R(x,y)}{U(x,y)} - \frac{R(x,y-1)}{U(x,y-1)} \right]^2 + \left[ \frac{R(x,y)}{U(x,y)} - \frac{R(x+1,y)}{U(x+1,y)} \right]^2$$

where K is the total number of points in the image, R(x,y) is the spatial reflectance and U(x,y) is the illumination intensity.

This function will also approach zero as fringes disappear. Note that this approach does not require a knowledge of the zero thickness air space reflectance.

The above identified equations can be easily programmed for solution with a computer 54 in a conventional manner. The digital output of the electronic camera 44 can then be fed directly into the computer 54 to provide the necessary variable input data to compute the respective merit functions based on fringe volume and/or nearest neighbor slopes.

In all cases, fringes in the gap 18 indicate that the chuck has not succeeded in pulling the wafer completely down to conform it to the chuck 12 or 24 surface as preferred.

The apparatus 10 of this invention can also be used with the metrology instrument of the present inventors U.S. patent application (Attorneys Docket No. 016-945250-NA) filed of even date herewith, which measures the thickness map of a semiconductor wafer by measuring the gaps on both sides of the wafer when it is placed between two optical flats one of which is preferably a chuck 12 or 24. The chuck 12 or 24 forces the gap 18 between the wafer and the chuck to be zero or to be some small fraction of a wave and allows the semiconductor wafer thickness to be measured by simply measuring the gap between the top of the wafer and the optical flat opposed thereto. By subtracting this later gap which is measured using a multispectral oblique incidence interferometer from the total chuck/optical flat separation the thickness of the wafer can be measured or a thickness map generated.

Wafer fabrication as the term is used herein refers to the processing of a semiconductor wafer through various photolithography, deposition, diffusion steps or the like for the purpose of creating electronic devices and circuits.

It should be understood that the foregoing description is only illustrative of the invention. Various alternatives and modifications can be devised by those skilled in the art without departing from the spirit of the invention. Accordingly, the present invention is intended to embrace all such alternatives, modifications and variations which fall within the scope of the appended claims.

What is claimed is:

1. A chuck for supporting a semiconductor wafer during wafer fabrication comprising:

a substrate transparent to narrow band illumination having an optically polished surface of a desired shape for supporting said wafer;

a system for securing said wafer over said polished surface so that said wafer substantially conforms thereto with a possibility that a gap may be formed between said potential surface and said wafer;

means for illuminating said gap through said substrate with said narrow band illumination to form interference fringes in said gap.

2. A chuck has in claim 1 wherein said substrate is formed of glass and said optically polished surface is flat.

3. A chuck as in claim 1 wherein said securing system comprises a system for applying a vacuum to said wafer through said substrate.

4. A chuck as in claim 1 wherein said securing system comprises a system for applying an electrostatic force on said wafer to force it into engagement over said polished surface.

5. A chuck as in claim 4 wherein said system for applying said electrostatic force comprises:

1) a monopole electrode on said polished surface of said substrate;

2) an insulating layer over said monopole electrode for spacing said electrode from said wafer by a desired amount;

3) said wafer and said monopole electrode being adapted to have a potential drop of sufficient magnitude created between them to provide said electrostatic force; and 4) said monopole electrode and said insulating layer being transparent to said means for illuminating.

6. A chuck as in claim 5 wherein:

1) said insulating layer comprises a high dielectric breakdown transparent membrane less than about 15 microns thick;

2) said monopole electrode comprises a transparent electrically conductive film electrode coated on one side of said membrane; and 3) said membrane is secured to said substrate so that said film is arranged therebetween; whereby a reduced voltage is required to conform the wafer to the substrate.

7. A chuck as in claim 6 wherein said membrane is formed from a material selected from the group consisting of: boron nitride, fused silica, aluminum oxide and silicon.

8. A chuck as in claim 6 wherein said electrode is formed from a metal grid having grid openings of greater than about 400 microns and grid lines of from about 30 to about 50 microns.

9. A chuck as in claim 4 wherein said system for applying said electrostatic force comprises:

1) a multipole electrode on said polished surface of said substrate, said multipole electrode comprising alternating electrode members of opposing polarity;

2) an insulating layer over said multipole electrode for spacing said electrode from said wafer by a desired amount;

3) said electrode members being adapted to have a potential drop of sufficient magnitude created between them to create said electrostatic force;

4) said multipole electrode and said insulating layer being transparent to said means for illuminating.

10. A chuck as in claim 9 wherein:

1) said insulating layer comprises a high dielectric breakdown transparent membrane less than about 15 microns thick;

2) said multipole electrode comprises transparent electrically conductive film electrodes coated on one side of said membrane; and 3) said membrane is secured to said substrate so that said film electrodes are arranged therebetween; whereby a reduced voltage is required to conform the wafer to the substrate.

11. A chuck as in claim 10 wherein said membrane is formed from a material selected from the group consisting of: boron nitride, fused silica, aluminum oxide and silicon.

12. A chuck as in claim 10 wherein said electrodes are formed from a metal grid having grid openings of greater than about 400 microns and grid lines of from about 30 to about 50 microns.

13. An apparatus for monitoring a residual gap between a semiconductor wafer and a chuck for supporting said semiconductor wafer comprising:

a transparent chuck having a surface of a desired shape for supporting said wafer;

a wafer supported over said chuck surface such that a first surface of said wafer opposes said chuck surface;

said residual gap being defined between said first surface of said wafer and said chuck surface;

a narrow band illumination source arranged to illuminate said gap through said transparent chuck, said illumination being selected to form interference fringes in said gap indicative of the thickness of said gap; and a camera for creating an image of said interference fringes.

14. An apparatus as in claim 13 wherein said camera is an electronic camera including a charged coupled device imaging system providing a digital output corresponding to said fringes in said gap and wherein said apparatus further includes a computer for receiving said output, said computer being adapted to calculate a merit function proportional to the total fringe volume.

15. An apparatus as in claim 13 wherein said camera is an electronic camera including a charged coupled device imaging system providing a digital output corresponding to said fringes in said gap and wherein said apparatus further includes a computer for receiving said output, said computer being adapted to calculate a merit function proportional to a summation of nearest neighbor slopes of said fringes.

16. An apparatus as in claim 13 wherein said illumination source is part of a Fizeau interferometer system further comprising a beam splitter arranged between said chuck and said camera and wherein said illumination source is arranged to illuminate said gap by reflection off said beam splitter.

17. A process for determining if a gap exists between a semiconductor wafer and a chuck supporting said wafer for processing comprising:

providing a transparent chuck having a surface of a desired shape for supporting said wafer;

supporting a wafer over said chuck surface such that a first surface of said wafer opposes said chuck surface, said gap being defined between said first surface of said wafer and said chuck surface;

illuminating said gap through said transparent chuck with a narrow band illumination, said illumination being selected to form interference fringes in said gap indicative of the thickness of said gap; and creating an image of said interference fringes.

18. A process as in claim 17 wherein said step of creating said image of said fringes comprises providing a digital image output corresponding to said fringes in said gap and wherein said process further comprises calculating a merit function proportional to the total fringe volume.

19. A process as in claim 18 wherein said merit function is calculated in accordance with the following formula:

$$\sum_{n=1}^{K} (R(x,y)/U(x,y) - R_{Theory}(x,y))^2$$

where K is the total number of points in the image, U(x,y) is the illumination intensity R(x,y) is the spatial reflectance and $R_{theory}$ is the computed reflectance for the case where the gap 18 is zero.

20. A process as in claim 17 wherein said step of creating said image of said fringes comprises providing a digital image output corresponding to said fringes in said gap and wherein said process further comprises calculating a merit function proportional to a summation of nearest neighbor slopes of said fringes.

21. A process as in claim 10 wherein said merit function is calculated in accordance with the following formula:

$$\sum_{n=1}^{K} \left[ \frac{R(x,y)}{U(x,y)} - \frac{R(x,y-1)}{U(x,y-1)} \right]^2 + \left[ \frac{R(x,y)}{U(x,y)} - \frac{R(x+1,y)}{U(x+1,y)} \right]^2$$

where K is the total number of points in the image, U(x,y) is the illumination intensity and R(x,y) is the spatial reflectance.

22. A process for making a transparent chuck for supporting a semiconductor wafer during wafer fabrication comprising:

1) providing a transparent substrate having an optically polished surface of a desired shape for supporting said wafer;

2) providing a high dielectric breakdown bulk transparent member;

3) thinning said member to form a membrane having a thickness of less than about 15 microns between first and second surfaces;

4) forming at least one electrically conductive film electrode on a the first surface of said membrane;

5) securing said membrane to said substrate with said electrode arranged between said substrate and said membrane; and 6) optically polishing the second surface of said membrane to make it substantially smooth and substantially parallel to said polished surface of said substrate.

23. A process as in claim 22 wherein said thinning and polishing steps are carried out by plasma assisted chemical etching.

24. A process as in claim 22 wherein said at least one electrode is formed from a metal grid having grid openings of greater than about 400 microns and grid lines of from about 30 to about 50 microns.

25. A process as in claim 22 wherein said membrane is formed from a material selected from the group consisting of: boron nitride, fused silica, aluminum oxide and silicon.

* * * * *